(12) United States Patent
Nada et al.

(10) Patent No.: US 9,099,504 B2
(45) Date of Patent: Aug. 4, 2015

(54) SUBSTRATE TREATMENT APPARATUS, AND SUBSTRATE TREATMENT METHOD

(75) Inventors: Kazunari Nada, Kyoto (JP); Kenichiro Arai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 1365 days.

(21) Appl. No.: 12/362,945

(22) Filed: Jan. 30, 2009

(65) Prior Publication Data

US 2009/0194509 A1 Aug. 6, 2009

(30) Foreign Application Priority Data

Jan. 31, 2008 (JP) .................................. 2008-021779
Dec. 2, 2008 (JP) .................................. 2008-307996

(51) Int. Cl.
| C23F 1/00 | (2006.01) |
| C23F 1/08 | (2006.01) |
| H01L 21/67 | (2006.01) |
| B05C 5/02 | (2006.01) |
| B05C 11/04 | (2006.01) |
| B05C 11/08 | (2006.01) |

(52) U.S. Cl.
CPC .......... *H01L 21/6708* (2013.01); *B05C 5/0254* (2013.01); *B05C 11/04* (2013.01); *B05C 11/08* (2013.01)

(58) Field of Classification Search
USPC ............. 156/345.55, 345.21, 345.11; 216/83; 134/902
See application file for complete search history.

(56) References Cited

U.S. PATENT DOCUMENTS

| 6,012,858 | A | 1/2000 | Konishi et al. |
| 6,280,299 | B1 | 8/2001 | Kennedy et al. |
| 2003/0012889 | A1 | 1/2003 | Ito et al. |
| 2003/0021906 | A1 | 1/2003 | Sago et al. |
| 2007/0107842 | A1* | 5/2007 | Ishimatsu et al. ........ 156/345.11 |

(Continued)

FOREIGN PATENT DOCUMENTS

| JP | 11-54394 | 2/1992 |
| JP | 5-234879 | 9/1993 |

(Continued)

OTHER PUBLICATIONS

Korean Office Action (Notice of Allowance) issued Mar. 4, 2011 in connection with corresponding Korean Patent Application No. 10-2009-0005623.

(Continued)

*Primary Examiner* — Sylvia R MacArthur
(74) *Attorney, Agent, or Firm* — Ostrolenk Faber LLP

(57) ABSTRACT

The substrate treatment apparatus according to the present invention includes a substrate holding mechanism which holds a substrate, a nozzle body having a spout which spouts an etching liquid toward a major surface of the substrate held by the substrate holding mechanism, a nozzle body movement mechanism which moves the nozzle body in a predetermined movement direction so as to move an etching liquid application position at which the etching liquid is applied on the major surface, a first flexible sheet attached to the nozzle body to be brought into contact with a portion of the major surface located on one of opposite sides of the etching liquid application position with respect to the movement direction, and a second flexible sheet attached to the nozzle body to be brought into contact with a portion of the major surface located on the other side of the etching liquid application position with respect to the movement direction.

20 Claims, 9 Drawing Sheets

(56) References Cited

U.S. PATENT DOCUMENTS

| | | | |
|---|---|---|---|
| 2008/0083501 A1* | 4/2008 | Arai et al. | 156/345.21 |
| 2009/0194234 A1* | 8/2009 | Arai et al. | 156/345.23 |
| 2009/0194509 A1* | 8/2009 | Nada et al. | 216/83 |

FOREIGN PATENT DOCUMENTS

| | | | | |
|---|---|---|---|---|
| JP | 6-333813 | | 12/1994 | |
| JP | 7-130617 | | 5/1995 | |
| JP | 2000-306809 | | 11/2000 | |
| JP | 2001-347211 | | 12/2001 | |
| JP | 2002110626 | * | 4/2002 | H01L 21/306 |
| JP | 2005-279451 | | 10/2005 | |
| JP | 2007-88381 | | 4/2007 | |
| WO | WO 2008/048259 | | 4/2008 | |

OTHER PUBLICATIONS

Each item of information contained in this Information Disclosure Statement was first cited in a communication from a foreign patent office in a counterpart application and this communication was not received by any individual designated in section 1.56(c) more than thirty days prior to the filing of this Information Disclosure Statement.

* cited by examiner

SUBSTRATE TREATMENT APPARATUS, AND SUBSTRATE TREATMENT METHOD

BACKGROUND OF THE INVENTION

1. Field of the Invention

The present invention relates to a substrate treatment apparatus and a substrate treatment method for performing an etching treatment to etch a major surface of a substrate with an etching liquid. Examples of the substrate to be subjected to the etching treatment include semiconductor wafers, glass substrates for liquid crystal display devices, glass substrates for plasma display devices, substrates for FED (Field Emission Display) devices, substrates for optical disks, substrates for magnetic disks, substrates for magneto-optical disks, and substrates for photo masks.

2. Description of Related Art

In semiconductor device production processes, a liquid treatment is often performed to treat a semiconductor wafer (hereinafter referred to simply as "wafer") with a treatment liquid. An exemplary liquid treatment is an etching treatment which is performed by supplying an etching liquid to a major surface of the wafer. Examples of the etching treatment as herein defined include an etching treatment for patterning the major surface of the wafer (the wafer per se or a thin film formed on the wafer), and a cleaning treatment for removing foreign matter from the major surface of the wafer by utilizing an etching effect.

A substrate treatment apparatus for treating the major surface of the wafer with the treatment liquid is of a batch treatment type which is adapted to treat a plurality of wafers at a time, or of a single substrate treatment type which is adapted to treat a single wafer at a time. The substrate treatment apparatus of the single substrate treatment type includes, for example, a spin chuck which generally horizontally holds and rotates the wafer, a treatment liquid nozzle which supplies the treatment liquid toward the major surface of the wafer held by the spin chuck, and a nozzle movement mechanism which moves the treatment liquid nozzle above the wafer.

Where it is desired to perform the etching treatment on a device formation surface of the wafer to be formed with a device, for example, the wafer is held by the spin chuck with the device formation surface thereof facing up. Then, the etching liquid is spouted from the treatment liquid nozzle onto an upper surface of the wafer rotated by the spin chuck, while the treatment liquid nozzle is moved by the nozzle movement mechanism. As the treatment liquid nozzle is moved, a liquid application position at which the etching liquid is applied on the upper surface of the wafer is moved. The etching liquid spreads over the entire upper surface of the wafer by scanning the liquid application position between a rotation center and a peripheral edge of the wafer on the upper surface of the wafer (see, for example, Japanese Unexamined Patent Publication No. 2007-88381).

However, the etching liquid supplied to a center portion of the upper surface of the wafer receives a centrifugal force generated by the rotation of the wafer to be thereby moved radially outward on the upper surface of the wafer. Therefore, a peripheral portion of the upper surface of the wafer is subjected to an excess amount of the etching liquid which includes the etching liquid directly supplied thereto from the treatment liquid nozzle and the etching liquid moved thereto from the center portion of the upper surface. Thus, the peripheral portion of the upper surface of the wafer is etched at a higher etching rate than the center portion, resulting in uneven treatment of the upper surface of the wafer.

The etching liquid spouted from the treatment liquid nozzle is active immediately after being supplied onto the upper surface of the wafer, but is deactivated with time. Unless the deactivated etching liquid is properly replaced with newly supplied etching liquid on the upper surface of the wafer, the deactivated etching liquid and the newly supplied etching liquid are mixed with each other on the upper surface of the wafer, resulting in reduced etching power of the etching liquid. As a result, the etching rate is likely to be reduced on the entire upper surface of the wafer.

Particularly, where the etching treatment is performed on a major surface of a silicon wafer, the upper surface of the wafer has lower affinity for the etching liquid. Therefore, the etching liquid is liable to remain on the upper surface of the wafer to from a thick liquid film on the upper surface of the wafer. This makes it difficult to replace the etching liquid present on the upper surface of the wafer with the newly supplied etching liquid.

An etching reaction occurring when the major surface of the silicon wafer per se is etched is exothermic, so that the upper surface of the wafer is heated to a very high temperature by the etching treatment. This further promotes the etching treatment. However, the thick liquid film formed on the upper surface of the wafer removes heat from the wafer, whereby the temperature of the upper surface of the wafer is reduced. This further reduces the etching rate.

SUMMARY OF THE INVENTION

It is an object of the present invention to provide a substrate treatment apparatus and a substrate treatment method which are capable of uniformly performing an etching treatment at a higher rate on the entire major surface of a substrate.

A substrate treatment apparatus according to the present invention includes a substrate holding mechanism which holds a substrate, a nozzle body having a spout which spouts an etching liquid toward a major surface of the substrate held by the substrate holding mechanism, a nozzle body movement mechanism which moves the nozzle body in a predetermined movement direction so as to move an etching liquid application position at which the etching liquid is applied on the major surface, a first flexible sheet attached to the nozzle body to be brought into contact with a portion of the major surface located on one of opposite sides (located forward) of the etching liquid application position with respect to the movement direction, and a second flexible sheet attached to the nozzle body to be brought into contact with a portion of the major surface located on the other side (located rearward) of the etching liquid application position with respect to the movement direction.

With this arrangement, the nozzle body is moved by the nozzle body movement mechanism to move the etching liquid application position on the major surface of the substrate. As the nozzle body is moved, the first sheet is moved in contact with the portion of the major surface of the substrate located on the one side of the application position with respect to the movement direction. Further, as the nozzle body is moved, the second sheet is moved in contact with the portion of the major surface of the substrate located on the other side of the application position with respect to the movement direction.

Where the nozzle body is moved with the first sheet located forward, deactivated etching liquid is removed from the major surface of the substrate by the first sheet. The etching liquid is newly supplied from the spout onto a portion of the major surface of the substrate over which the first sheet has passed. The etching liquid newly supplied onto the major surface of the substrate is evenly spread by the movement of the second sheet which follows the first sheet. As a result, a liquid film of the etching liquid is formed as having a smaller and uniform thickness over the entire major surface of the substrate.

Since the liquid film of the newly supplied etching liquid is formed over the entire major surface of the substrate, the etching liquid is uniformly supplied onto the entire major surface. This improves the in-plane uniformity of the etching treatment.

Further, the etching liquid is newly supplied onto the major surface of the substrate after the deactivated etching liquid is removed. Therefore, the newly supplied etching liquid is substantially prevented from being mixed with the deactivated etching liquid. This prevents formation of an etching liquid film having a weaker etching power on the major surface of the substrate, thereby improving the etching rate. Thus, the etching treatment can be uniformly performed at a higher rate over the entire major surface of the substrate.

The first sheet and the second sheet are preferably brought into contact with the entire major surface by moving the nozzle body by means of the nozzle body movement mechanism.

With this arrangement, the first sheet and the second sheet can be brought into contact with the entire major surface of the substrate. Thus, the deactivated etching liquid can be removed from the entire major surface of the substrate and, at the same time, the liquid film of the newly supplied etching liquid can be formed as having a smaller and uniform thickness over the entire major surface of the substrate.

More specifically, where the substrate held by the substrate holding mechanism is a round substrate, the first sheet and the second sheet may each have a length that is greater than the diameter of the round substrate (as measured parallel to the major surface of the substrate).

The first sheet and the second sheet may each be attached to the nozzle body as extending perpendicularly to the movement direction.

The spout includes a slit spout having a linear opening extending in a predetermined opening direction, and the second sheet is preferably attached to the nozzle body as extending in the predetermined opening direction.

With this arrangement, the etching liquid is spouted onto the major surface of the substrate in the form of a stream having a profile elongated in the predetermined opening direction. The etching liquid spouted in the form of the elongated profile stream is evenly spread by the second sheet which extends in the same direction. Therefore, even if the etching liquid is spouted at a lower flow rate from the spout of the nozzle body, the etching liquid can be spread over the entire major surface of the substrate. This makes it possible to reduce the flow rate of the etching liquid while ensuring proper etching treatment on the major surface of the substrate.

The nozzle body movement mechanism is preferably adapted to move the nozzle body in the movement direction so as to bring the second sheet out of contact with the major surface of the substrate.

With this arrangement, the first sheet and the second sheet can be brought into contact with the entire major surface of the substrate, as the nozzle body is moved in the movement direction. Thus, the etching treatment can be uniformly performed at a higher rate on the entire major surface of the substrate.

The first sheet and the second sheet preferably each have a multiplicity of passage holes through which the etching liquid supplied onto the major surface passes.

With this arrangement, a part of the etching liquid brought into contact with the first sheet passes through the multiplicity of passage holes to remain on the major surface of the substrate. Further, a part of the etching liquid brought into contact with the second sheet passes through the passage holes to remain on the major surface of the substrate. This prevents the major surface of the substrate from being dried immediately after the first sheet and the second sheet pass over the major surface. The prevention of the drying of the major surface of the substrate prevents reduction in the in-plane uniformity and the etching rate of the etching treatment.

The substrate holding mechanism preferably includes a support member which horizontally supports the substrate, and a limitation surface disposed on a lateral side of the major surface of the substrate supported by the support member for receiving a part of the etching liquid moved together with the second sheet.

With this arrangement, the etching liquid moved together with the second sheet is received by the limitation surface. The etching liquid received by the limitation surface is applied to the major surface of the substrate. This suppresses or prevents the drying of the major surface of the substrate, thereby preventing the reduction in the in-plane uniformity and the etching rate of the etching treatment.

The substrate holding mechanism preferably further includes an opposition surface which is brought into opposed relation to a peripheral surface of the substrate supported by the support member, and a step which connects the opposition surface and the limitation surface for retaining the part of the etching liquid received by the limitation surface.

With this arrangement, the etching liquid is retained in the step. The etching liquid retained in the step is applied to the major surface of the substrate. Therefore, a greater amount of the etching liquid can be applied to the major surface of the substrate. This further efficiently prevents the drying of the major surface of the substrate.

The substrate holding mechanism may include a substrate support, and a base member which supports the substrate support, and the substrate support may include the support member and the limitation surface.

Alternatively, the substrate holding mechanism may include a base member which includes the support member and the limitation surface.

The nozzle body movement mechanism may be adapted to reciprocally move the nozzle body along the movement direction. In this case, the function of the first sheet and the function of the second sheet are exchanged with each other when the movement of the nozzle body is switched from forward travel in which the nozzle body is moved in the movement direction to reverse travel in which the nozzle body is moved in a direction opposite to the movement direction.

The apparatus may further include a substrate rotating mechanism which rotates the substrate held by the substrate holding mechanism. In this case, the attitude of the substrate can be changed with respect to the nozzle body movement direction by the substrate rotating mechanism. Thus, the etching treatment can be uniformly performed on the major surface of the substrate.

A substrate treatment method according to the present invention includes the steps of supplying an etching liquid from a spout of a nozzle body toward a major surface of a substrate held by a substrate holding mechanism, moving the nozzle body in a predetermined movement direction so as to move an etching liquid application position at which the etching liquid is applied on the major surface, bringing a first flexible sheet attached to the nozzle body into contact with a portion of the major surface located on one of opposite sides (located forward) of the etching liquid application position with respect to the movement direction to remove the liquid from the forward portion, and bringing a second flexible sheet attached to the nozzle body into contact with a portion of the major surface located on the other side (located rearward) of the etching liquid application position with respect to the movement direction so as to evenly spread the supplied etching liquid over the major surface.

According to this method, where the nozzle body is moved with the first sheet located forward, deactivated etching liquid is removed from the major surface of the substrate by the first sheet. The etching liquid is newly supplied from the spout onto a portion of the major surface of the substrate over which the first sheet has passed. The etching liquid newly supplied onto the major surface of the substrate is evenly spread by the movement of the second sheet which follows the first sheet. As a result, a liquid film of the etching liquid is formed as having a smaller and uniform thickness over the entire major surface of the substrate.

Since the liquid film of the newly supplied etching liquid is formed over the entire major surface of the substrate, the etching liquid is uniformly supplied onto the entire major surface. This improves the in-plane uniformity of the etching treatment.

Further, the etching liquid is newly supplied onto the major surface of the substrate after the deactivated etching liquid is removed. Therefore, the newly supplied etching liquid is substantially prevented from being mixed with the deactivated etching liquid. This prevents formation of an etching liquid film having a weaker etching power on the major surface of the substrate, thereby improving the etching rate. Thus, the etching treatment can be uniformly performed at a higher rate over the entire major surface of the substrate.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1A:
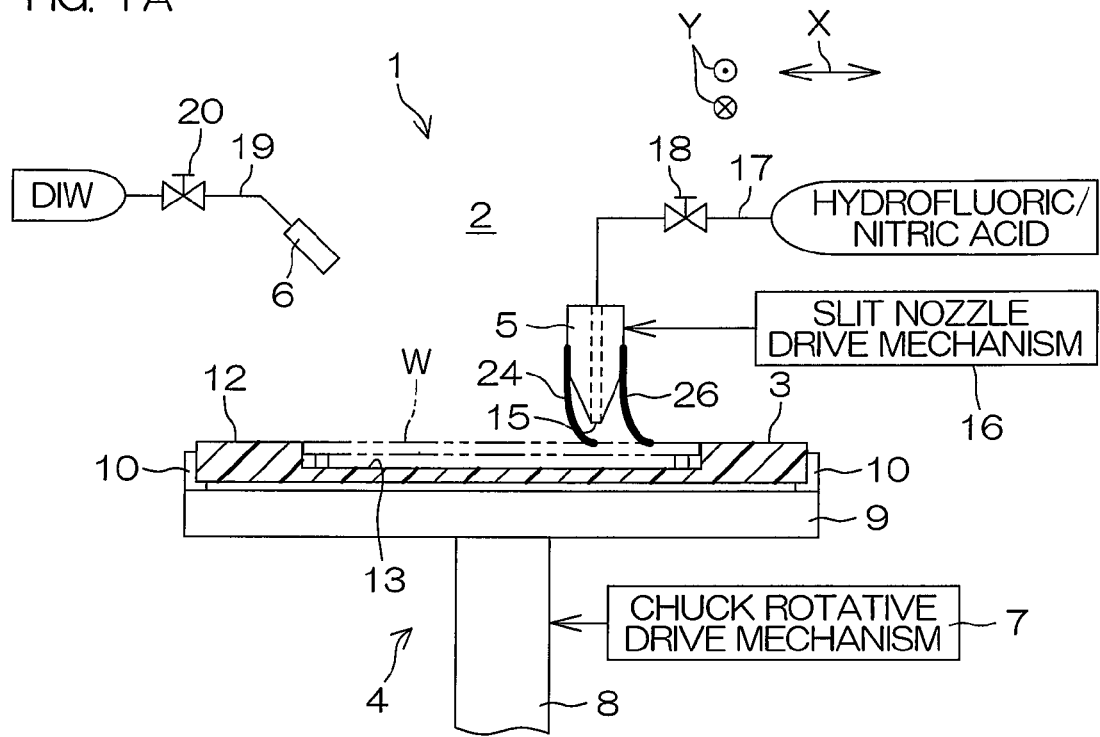
FIG. 1A is a sectional view schematically showing the construction of a substrate treatment apparatus according to a first embodiment of the present invention.
Figure 1B:
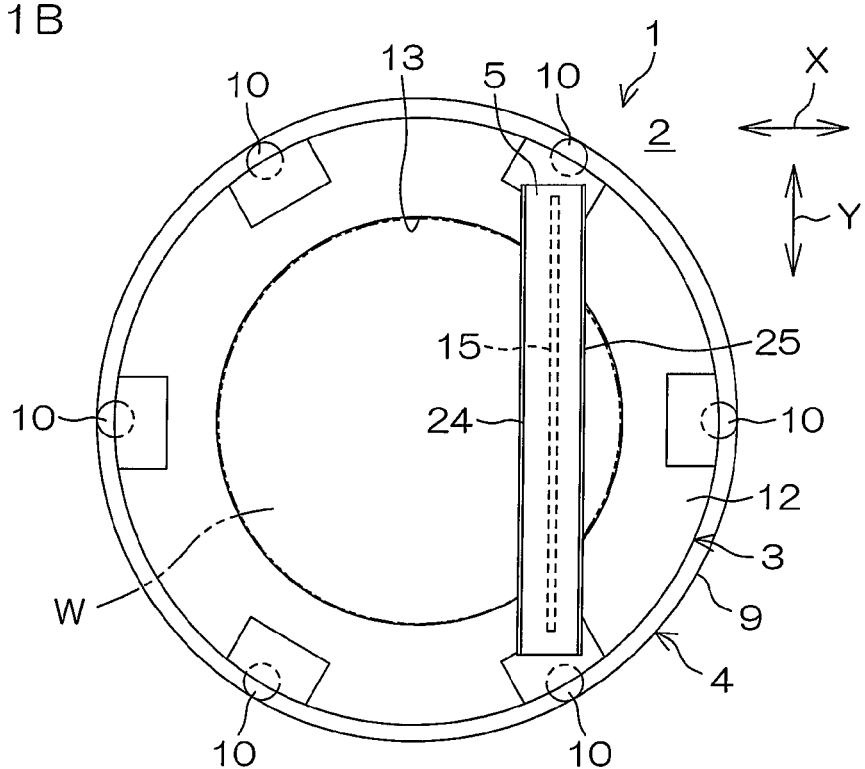
FIG. 1B is a plan view schematically showing the construction of the substrate treatment apparatus shown in FIG. 1A.

FIG. 1A is a sectional view schematically showing the construction of a substrate treatment apparatus 1 according to one embodiment (first embodiment) of the present invention. FIG. 1B is a plan view schematically showing the construction of the substrate treatment apparatus 1 shown in FIG. 1A.

The substrate treatment apparatus 1 is of a single substrate treatment type which performs an etching treatment on a back surface (upper surface) opposite from a front surface (device formation surface) of a round wafer W such as a silicon wafer for thinning the wafer W. In this embodiment, hydrofluoric/nitric acid (a mixture of hydrofluoric acid and nitric acid) is used as an etching liquid.

The substrate treatment apparatus 1 includes a substrate support (susceptor) 3 which generally horizontally holds the wafer W, a spin chuck 4 which holds the substrate support 3 and rotates the wafer W and the substrate support 3 about a vertical axis extending through the center of the wafer W, a slit nozzle 5 which supplies hydrofluoric/nitric acid onto the upper surface of the wafer W held by the substrate support 3, and a DIW nozzle 6 which supplies DIW (deionized water) toward the upper surface of the wafer W held by the substrate support 3. These components are disposed in a treatment chamber 2 defined by a partition wall (not shown).

The spin chuck 4 includes a disk-shaped spin base 9 fixed to an upper end of a rotation shaft 8 which is rotated about a vertical axis by a rotative drive force of a chuck rotative drive mechanism (substrate rotating mechanism) 7, and a plurality of holder members 10 disposed generally equidistantly circumferentially of the spin base 9 for holding the substrate support 3 so as to horizontally hold the wafer W. Thus, the spin chuck 4 generally horizontally holds the wafer W and rotates the wafer W about the vertical axis by rotating the rotation shaft 8 by the rotative drive force of the chuck rotative drive mechanism 7 with the substrate support 3 being held by the plurality of holder members 10.

The substrate support 3 has a disk shape having a smaller diameter than the spin base 9. The substrate support 3 has a flat upper surface 12 which is located horizontally when it is held by the spin chuck 4. The substrate support 3 has a hollow cylindrical accommodation recess 13 provided in a center portion of the upper surface 12 thereof for accommodating the wafer W.

The slit nozzle 5 includes a slit spout 15 which is an opening linearly extending along a predefined Y-axis and opposed to the upper surface of the wafer W held by the substrate support 3. The slit nozzle 5 is supported slidably along an X-axis perpendicular to the Y-axis by a support rail (not shown). The X-axis and the Y-axis extend parallel to the upper surface of the wafer W (horizontally). A slit nozzle drive mechanism (nozzle body movement mechanism) 16 is connected to the slit nozzle 5. The slit nozzle 5 is reciprocally moved along the X-axis by a drive force of the slit nozzle drive mechanism 16.

A hydrofluoric/nitric acid supply pipe 17 is connected to the slit nozzle 5 to communicate with the slit spout 15. Hydrofluoric/nitric acid is supplied from a hydrofluoric/nitric acid supply source to the hydrofluoric/nitric acid supply pipe 17. A hydrofluoric/nitric acid valve 18 is provided in the hydrofluoric/nitric acid supply pipe 17 for switchably permitting and prohibiting the supply of hydrofluoric/nitric acid to the slit nozzle 5.

The DIW nozzle 6 is, for example, a straight nozzle which spouts DIW in the form of a continuous stream. The DIW nozzle 6 is disposed above the spin chuck 4 with its spout directing toward a center portion of the wafer W. A DIW supply pipe 19 is connected to the DIW nozzle 6. DIW is supplied to the DIW nozzle 6 from a DIW supply source through the DIW supply pipe 19. A DIW valve 20 is provided in the DIW supply pipe 19 for switchably permitting and prohibiting the supply of DIW to the DIW nozzle 6. In FIG. 1B, the hydrofluoric/nitric acid supply pipe 17, the hydrofluoric/nitric acid valve 18, the DIW nozzle 6, the DIW supply pipe 19 and the DIW valve 20 are not shown.

Figure 2:
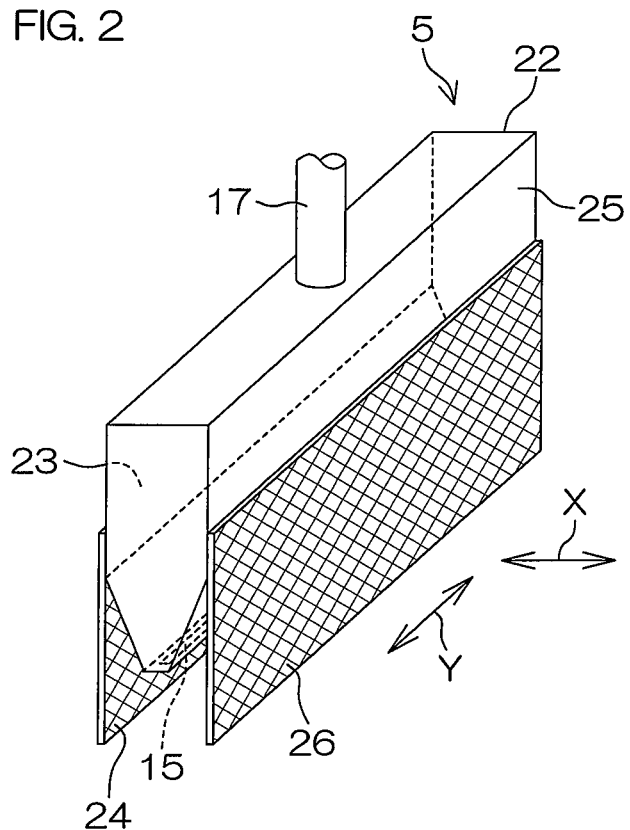
FIG. 2 is a perspective view showing the structure of a slit nozzle.

FIG. 2 is a perspective view showing the structure of the slit nozzle 5.

The slit nozzle 5 includes a nozzle body 22 having a generally rectangular solid outer shape elongated along the Y-axis. A sectional shape of the nozzle body 22 taken along the X-axis is tapered downward. The slit spout 15 is provided in a lower end surface of the nozzle body 22. The length of the slit spout 15 as measured along the Y-axis is greater than the diameter of the wafer W. The slit spout 15 has an opening width of, for example, about 0.5 mm. Hydrofluoric/nitric acid is spouted from the slit spout 15 in the form of a stream having a profile elongated along the Y-axis.

A first rectangular flexible sheet 24 elongated along the Y-axis is vertically attached to one side surface 23 of opposite side surfaces of the nozzle body 22 (on a rear left side in FIG. 2). The first sheet 24 is a mesh sheet having a multiplicity of 300-μm square openings and composed of PFA (tetrafluoroethylene perfluoroalkoxyethylene copolymer resin). The length of the first sheet 24 as measured along the Y-axis is greater than the diameter of the wafer W. The width of the first sheet 24 as measured normally to the wafer W is such that the first sheet 24 is bowed with its distal edge kept in contact with the upper surface of the wafer W supported by the substrate support 3.

A second rectangular flexible sheet 26 elongated along the Y-axis is vertically attached to the other side surface 25 of the nozzle body 22 (on a front right side in FIG. 2). The second sheet 26 is a mesh sheet having a multiplicity of 300-μm square openings and composed of PFA (tetrafluoroethylene perfluoroalkoxyethylene copolymer resin). The length of the second sheet 26 as measured along the Y-axis is greater than the diameter of the wafer W. A width of the second sheet 26 as measured normally to the wafer W is such that the second sheet 26 is bowed with its distal edge kept in contact with the upper surface of the wafer W supported by the substrate support 3.

Figure 3A:
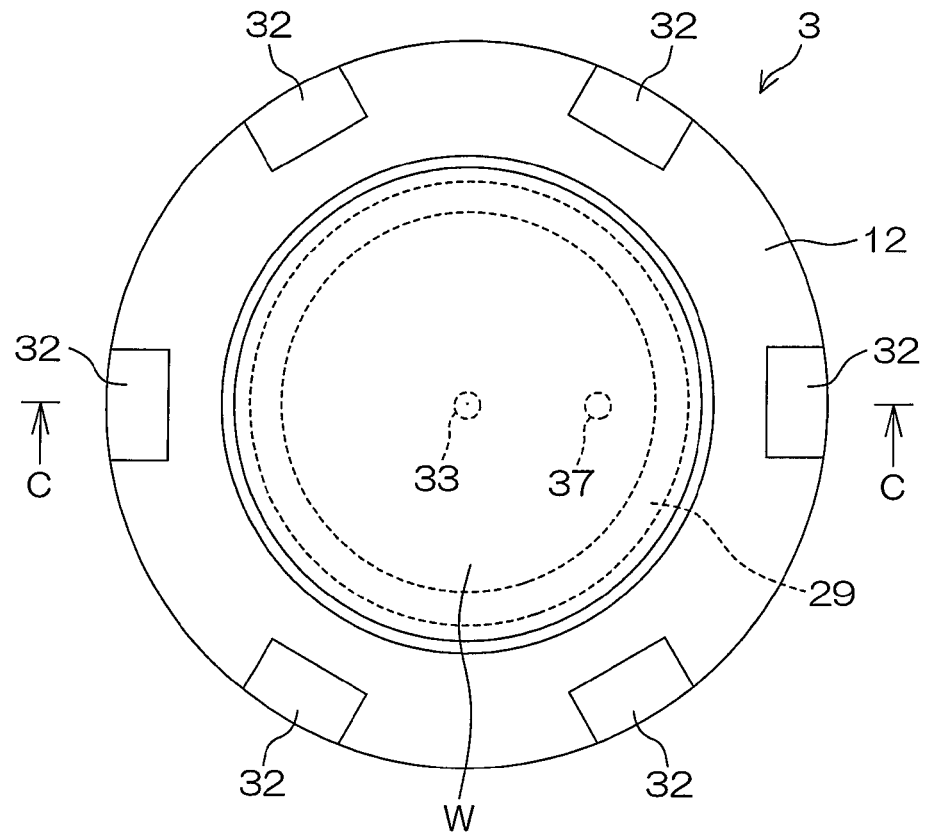
FIG. 3A is a plan view showing the structure of a substrate support.
Figure 3B:
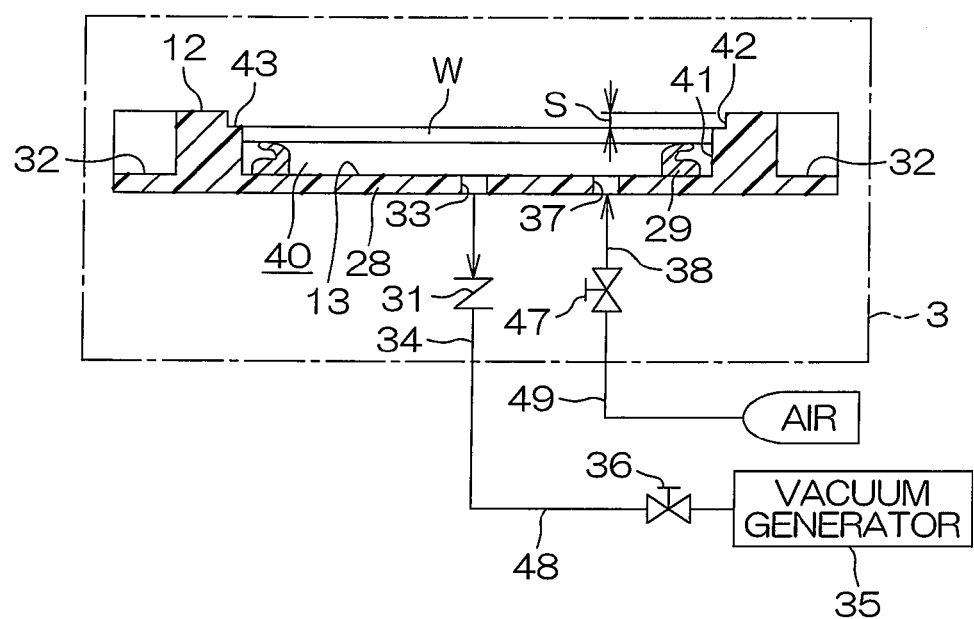
FIG. 3B is a sectional view taken along a section line C-C in FIG. 3A.

FIG. 3A is a plan view showing the structure of the substrate support 3. FIG. 3B is a sectional view taken along a section line C-C in FIG. 3A.

The substrate support 3 is formed of polyvinyl chloride.

An annular seal member 29 serving as a support member for supporting the wafer W is provided along a peripheral edge of a bottom 28 of the accommodation recess 13 on an upper surface of the bottom 28. The lower surface of the wafer W is supported by the seal member 29. The seal member 29 may be a lip packing as shown in FIG. 3B, or may be a surface packing. Where the lip packing is used as the seal member 29, the seal member 29 has a sufficiently rigid inner peripheral surface to precisely define the height of the upper surface of the wafer W.

An inner peripheral surface of the accommodation recess 13 includes a first cylindrical surface (opposition surface) 41 having substantially the same diameter as the wafer W, and a second cylindrical surface (limitation surface) 42 provided above the first cylindrical surface 41 and having a greater diameter than the first cylindrical surface 41. An annular step 43 is provided along an upper edge of the first cylindrical surface 41 to connect the first cylindrical surface 41 to the second cylindrical surface 42. The annular step 43 has a horizontal surface that is flush with the upper surface of the wafer W (yet to be subjected to the etching treatment) held in the accommodation recess 13. A level difference S between the upper surface 12 and the annular step 43 is, for example, in the range of 0.5 to 1.0 mm. The annular step 43 has a width of, for example, 0 to 3 mm.

The substrate support 3 has a plurality of engagement recesses 32 generally equidistantly provided in a peripheral portion of the upper surface 12 thereof. The engagement recesses 32 are disposed in association with the respective holder members 10. With the holder members 10 in engagement with the respective engagement recesses 32, the substrate support 3 is fixed to the spin chuck 4.

The accommodation recess 13 has a suction port 33 formed at the center of the bottom 28 thereof. A first suction pipe 34 is connected to the suction port 33 at one end thereof. A check valve 31 is provided in the first suction pipe 34. The check valve 31 permits passage of air sucked from the suction port 33 into a vacuum generator 35, and prevents reverse flow of the air. One end of a second suction pipe 48 is connectable to the other end of the first suction pipe 34. The other end of the second suction pipe 48 is connected to the vacuum generator 35 which serves as a suction mechanism. A suction valve 36 is provided in the second suction pipe 48 for switchably opening and closing the second suction pipe 48.

The accommodation recess 13 further has a vacuum relief port 37 formed in the bottom 28 thereof. A first air supply pipe 38 is connected to the relief port 37 at one end thereof. A relief valve 47 for opening and closing the first air supply pipe 38 is provided in the first air supply pipe 38. One end of a second air supply pipe 49 is connectable to the other end of the first air supply pipe 38. An air supply source is connected to the other end of the second air supply pipe 49, so that high pressure air can be supplied from the air supply source to the first air supply pipe 38 through the second air supply pipe 49. Among the aforementioned pipes and valves, the first suction pipe 34, the check valve 31, the first air supply pipe 38 and the relief valve 47 are attached to the substrate support 3.

When the relief valve 47 is closed and the suction valve 36 is opened with the vacuum generator 35 being active, with the wafer W being accommodated in the accommodation recess 13 and with the one end of the second suction pipe 48 being connected to the other end of the first suction pipe 34, air is sucked from a space 40 defined between the bottom 28 and the wafer W, whereby the lower surface (device formation surface) of the wafer W is held by suction. Even if the suction valve 36 is thereafter closed and the first suction pipe 34 is disconnected from the second suction pipe 48, the check valve 31 and the closed relief valve 47 prevent air from flowing into the space 40. Thus, the lower surface of the wafer W is continuously held by suction. With the wafer W being held by suction, the peripheral portion of the lower surface of the wafer W is kept in intimate contact with an upper portion of the seal member 29, whereby hydrofluoric/nitric acid is prevented from intruding into the lower surface (device formation region) of the wafer W.

When the relief valve 47 is opened with the one end of the second air supply pipe 49 being connected to the other end of the first air supply pipe 38 and with the wafer W being held on the substrate support 3 by suction, high pressure air is supplied into the space 40 defined between the bottom 28 and the wafer W, and the vacuum is relieved in the space 40. Thus, the wafer W is released from the suction holding, so that the wafer W can be detached from the substrate support 3.

Figure 4:
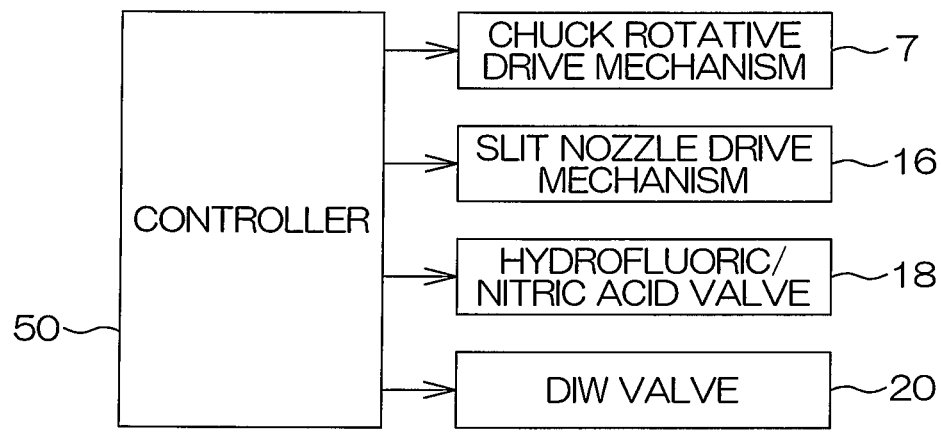
FIG. 4 is a block diagram showing the electrical construction of the substrate treatment apparatus shown in FIG. 1A.

FIG. 4 is a block diagram showing the electrical construction of the substrate treatment apparatus 1.

The substrate treatment apparatus 1 includes a controller 50 including a microcomputer.

The chuck rotative drive mechanism 7, the slit nozzle drive mechanism 16, the hydrofluoric/nitric acid valve 18, the DIW valve 20 and the like are connected as control objects to the controller 50.

Figure 5:
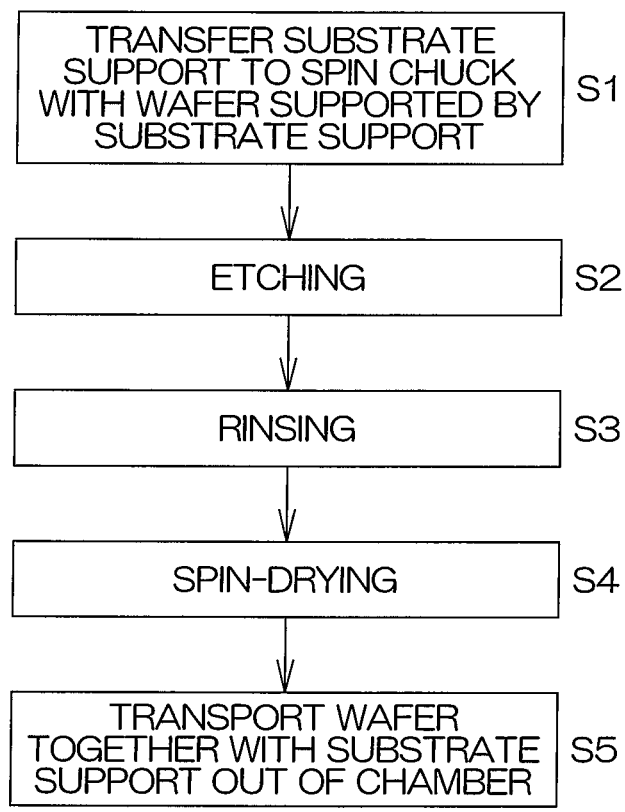
FIG. 5 is a flow chart showing an exemplary wafer treatment to be performed by the substrate treatment apparatus shown in FIG. 1A.
Figure 6A:
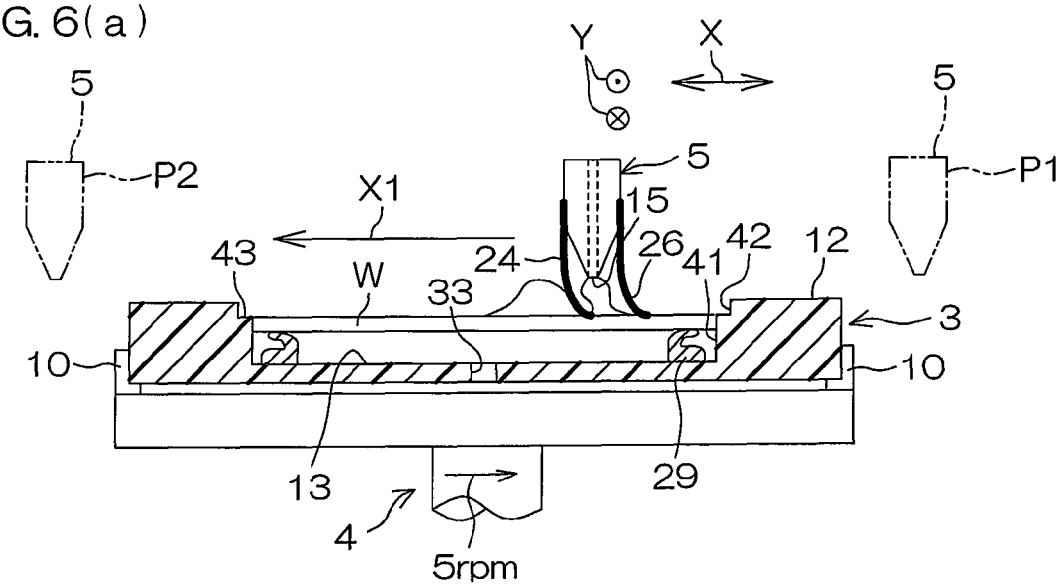
FIGS. 6(a) to 6(c) are sectional views for explaining a wafer etching treatment to be performed by the substrate treatment apparatus shown in FIG. 1A.
Figure 6B:
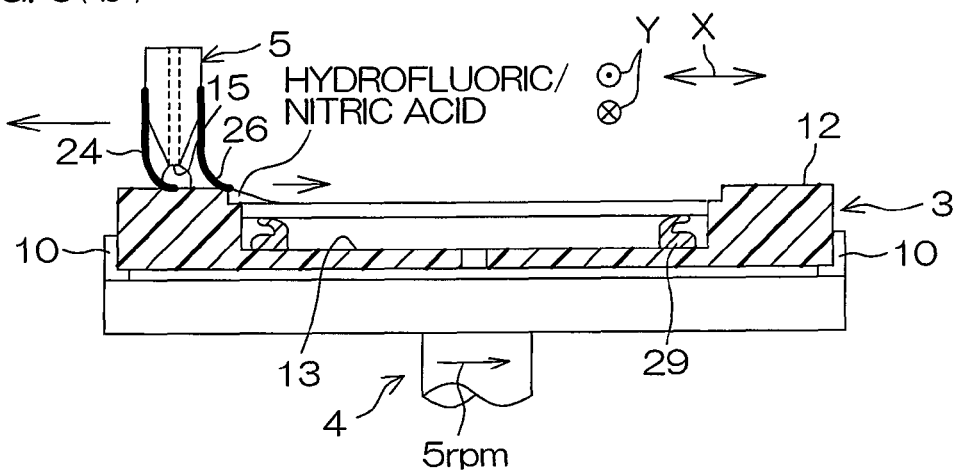
Figure 6C:
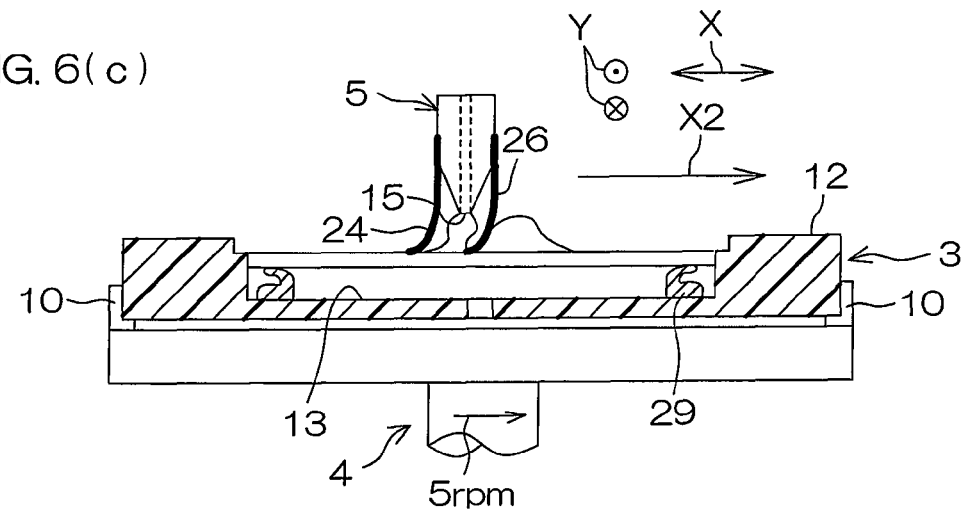

FIG. 5 is a flow chart showing an exemplary wafer treatment to be performed by the substrate treatment apparatus 1. FIGS. 6(a) to 6(c) are sectional views for explaining a wafer etching treatment to be performed by the substrate treatment apparatus 1.

Prior to the wafer treatment, an untreated wafer W is supported by the substrate support 3. More specifically, the wafer W is accommodated in the accommodation recess 13 with the upper surface 12 of the substrate support 3 facing up, and then the suction valve 36 is opened with the relief valve 47 kept closed. Thus, the lower surface (device formation surface) of the wafer W is held by suction.

For the wafer treatment, the substrate support 3 which supports the untreated wafer W is transported into the treatment chamber 2 by a transport robot (not shown), and transferred to the spin chuck 4 (Step S1). At this time, the slit nozzle 5 is located at a retracted position on a lateral side of the spin chuck 4. Further, the hydrofluoric/nitric acid valve 18 and the DIW valve 20 are controlled to be closed.

After the transfer of the substrate support 3 to the spin chuck 4, the controller 50 drives the chuck rotative drive mechanism 7 to rotate the spin chuck 4 at a lower constant rotation speed (e.g., 5 rpm). Further, the controller 50 drives the slit nozzle drive mechanism 16 to guide the slit nozzle 5 to above the wafer W.

When the slit nozzle 5 reaches above the wafer W, the controller 50 opens the hydrofluoric/nitric acid valve 18 to spout hydrofluoric/nitric acid from the slit spout 15 in the form of a stream having a profile elongated along the Y-axis. Further, the controller 50 drives the slit nozzle drive mechanism 16 to reciprocally move (or scan) the slit nozzle 5 along the X-axis between a scan start position P1 located outside an upper region of the substrate support 3 (as indicated by a two-dot-and-dash line in FIG. 6(a)) and a return position P2 located diametrically opposite from the scan start position P1 about the rotation center of the wafer W outside the upper region of the substrate support 3 (as indicated by a two-dot-and-dash line in FIG. 6(a)) (S2: etching treatment).

The first sheet 24 and the second sheet 26 each have the length that is greater than the diameter of the wafer W and, therefore, can be brought into contact with the entire upper surface of the wafer W.

More specifically, when the slit nozzle 5 is moved in one movement direction X1 along the X-axis as shown in FIG. 6(a), the first sheet 24 is brought into contact with a portion of the upper surface of the wafer W located forward of the hydrofluoric/nitric acid application position with respect to the movement direction X1. At this time, the first sheet 24 is bowed convexly forward with respect to the movement direction X1, so that the distal edge of the first sheet 24 is kept in intimate contact with the upper surface of the wafer W. As the slit nozzle 5 is moved, the first sheet 24 is moved in contact with the upper surface of the wafer W. Thus, deactivate hydrofluoric/nitric acid is scraped away from the upper surface of the wafer W.

Further, the second sheet 26 is brought into contact with a portion of the upper surface of the wafer W located rearward of the hydrofluoric/nitric acid application position with respect to the movement direction X1. At this time, the second sheet 26 is bowed convexly forward with respect to the movement direction X1, so that the distal edge of the second sheet 26 is kept in intimate contact with the upper surface of the wafer W. As the slit nozzle 5 is moved, the second sheet 26 is moved in contact with the upper surface of the wafer W. Thus, hydrofluoric/nitric acid supplied onto the upper surface of the wafer W between the first sheet 24 and the second sheet 26 is evenly spread over the upper surface of the wafer W.

Hydrofluoric/nitric acid spouted from the slit spout 15 is evenly spread by the second sheet 26 extending along the Y-axis. Therefore, even if hydrofluoric/nitric acid is spouted at a lower flow rate from the slit spout 15, hydrofluoric/nitric acid can be efficiently evenly spread over the upper surface of the wafer W.

When the slit nozzle 5 reaches the peripheral portion of the wafer W, the distal edges of the first sheet 24 and the second sheet 26 are located on the upper surface 12 of the substrate support 3. At this time, hydrofluoric/nitric acid moved together with the second sheet 26 is received by the second cylindrical surface 42 and retained on the annular step 43. The hydrofluoric/nitric acid retained on the annular step 43 generally flush with the wafer W is moved toward the upper surface of the wafer W after passage of the slit nozzle 5. Thus, the upper surface of the wafer W, particularly, the peripheral portion of the upper surface of the wafer W, is substantially prevented from being dried immediately after passage of the first sheet 24 and the second sheet 26.

When the slit nozzle 5 thereafter reaches the return position P2, the controller 50 drives the slit nozzle drive mechanism 16 to return the slit nozzle 5 with the hydrofluoric/nitric acid valve 18 kept open, whereby the slit nozzle 5 is moved in a movement direction X2 (opposite to the movement direction X1) along the X-axis as shown in FIG. 6(c).

When the slit nozzle 5 is moved in the movement direction X2 along the X-axis, the second sheet 26 is brought into contact with a portion of the upper surface of the wafer W forward of the hydrofluoric/nitric acid application position with respect to the movement direction X2. As the slit nozzle 5 is moved, the second sheet 26 is moved in contact with the upper surface of the wafer W. Thus, deactivated hydrofluoric/nitric acid is scraped away from the upper surface of the wafer W.

Further, the first sheet 24 is brought into contact with a portion of the upper surface of the wafer W rearward of the hydrofluoric/nitric acid application position with respect to the movement direction X2. As the slit nozzle 5 is moved, the first sheet 24 is moved in contact with the upper surface of the wafer W. Thus, hydrofluoric/nitric acid supplied onto the upper surface of the wafer W between the first sheet 24 and the second sheet 26 is evenly spread over the upper surface of the wafer W. During the movement of the slit nozzle 5, the flow rate of hydrofluoric/nitric acid spouted from the slit nozzle 5 is kept at a constant level (e.g., 1.2 L/min).

After the etching treatment is performed for a predetermined period (e.g., 300 seconds), the controller 50 closes the hydrofluoric/nitric acid valve 18 to stop the spouting of hydrofluoric/nitric acid from the slit nozzle 5. Further, the controller 50 drives the slit nozzle drive mechanism 16 to retract the slit nozzle 5 to the retracted position on the lateral side of the spin chuck 4.

In turn, the controller 50 controls the chuck rotative drive mechanism 7 to accelerate the spin chuck 4 to a predetermined rinsing rotation speed (about 100 rpm), and opens the DIW valve 20 to supply DIW from the DIW nozzle 6 toward the rotation center of the upper surface of the rotating wafer W (Step S3). Thus, a rinsing process is performed on the wafer W to wash away hydrofluoric/nitric acid from the wafer W. During the rinsing process, the flow rate of DIW spouted from the DIW nozzle 6 is, for example, 2.0 L/min.

After the rinsing process is performed for a predetermined period (e.g., 60 seconds), the controller 50 closes the DIW valve 20 to complete the rinsing process. Further, the controller 50 controls the chuck rotative drive mechanism 7 to accelerate the spin chuck 4 to a predetermined drying rotation speed (about 1000 to about 2000 rpm). Thus, a spin-drying process is performed on the wafer W to spin out DIW from the upper surface of the wafer W by a centrifugal force (Step S4).

After the spin-drying process is performed for a predetermined period (e.g., 30 seconds), the controller 50 controls the chuck rotative drive mechanism 7 to stop the rotation of the spin chuck 4. Thereafter, the treated wafer W is transported together with the substrate support 3 out of the treatment chamber 2 by the transport robot (Step S5).

Next, an inventive example and a comparative example will be described.

An etching test was performed to etch an upper surface (back surface) of a rotating wafer (silicon wafer) W having an outer diameter of 200 mm for thinning the wafer W by supplying hydrofluoric/nitric acid.

In the etching test, the slit nozzle 5 was reciprocally moved along the X-axis between opposite sides of the wafer W. Hydrofluoric/nitric acid, which was prepared by mixing nitric acid and hydrofluoric acid in a volume ratio of 5:1, was spouted at a flow rate of 1.2 L/min from the slit nozzle 5 onto the wafer W. The etching treatment period was 600 seconds, and the scanning speed for the etching treatment was 150 mm/sec. The rotation speed of the wafer W for the etching treatment was 5 rpm. The etching rate was calculated based on the etching amount of the wafer W.

In the inventive example, the etching treatment was performed by the substrate treatment apparatus 1 of FIG. 1.

In the comparative example, the etching treatment was performed by a substrate treatment apparatus having substantially the same construction as the substrate treatment apparatus 1 of FIG. 1 but not having the first sheet 24 and the second sheet 26.

As a result of the etching test, it was found that, even if the distance from the rotation center varies, the etching rate profile was generally constant in the inventive example and the comparative example. This means that the inventive example and the comparative example were both excellent in the in-plane uniformity of the etching treatment.

On the other hand, the etching rate was about 11 (μm/min) in the comparative example, and was about 20 (μm/min) in the inventive example. This means that the etching rate was higher in the inventive example.

According to this embodiment, the slit nozzle 5 is moved by the slit nozzle drive mechanism 16 to move the hydrofluoric/nitric acid application position on the upper surface of the wafer W. As the slit nozzle 5 is moved, the first sheet 24 is moved in contact with the portion of the upper surface of the wafer W located forward of the application position with respect to the movement direction X1. Further, as the slit nozzle 5 is moved, the second sheet 26 is moved in contact with the portion of the upper surface of the wafer W located rearward of the application position with respect to the movement direction X1.

Where the slit nozzle 5 is moved with the first sheet 24 located forward, the deactivated hydrofluoric/nitric acid is removed from the upper surface of the wafer W by the first sheet 24. Then, hydrofluoric/nitric acid is newly supplied onto the upper surface of the wafer W after the passage of the first sheet 24. The hydrofluoric/nitric acid newly supplied onto the upper surface of the wafer W is evenly spread by the moving of the second sheet 26. As a result, a liquid film of hydrofluoric/nitric acid is formed as having a smaller and uniform thickness over the entire upper surface of the wafer W. Since hydrofluoric/nitric acid is newly supplied onto the upper surface of the wafer W after the removal of the deactivated hydrofluoric/nitric acid, the newly supplied hydrofluoric/nitric acid is substantially prevented from being mixed with the deactivated hydrofluoric/nitric acid. This prevents formation of a liquid film of hydrofluoric/nitric acid having a weaker etching power on the upper surface of the wafer W, thereby improving the etching rate.

Thus, it is possible to uniformly perform the etching treatment at a higher rate on the entire upper surface of the wafer W.

Figure 7:
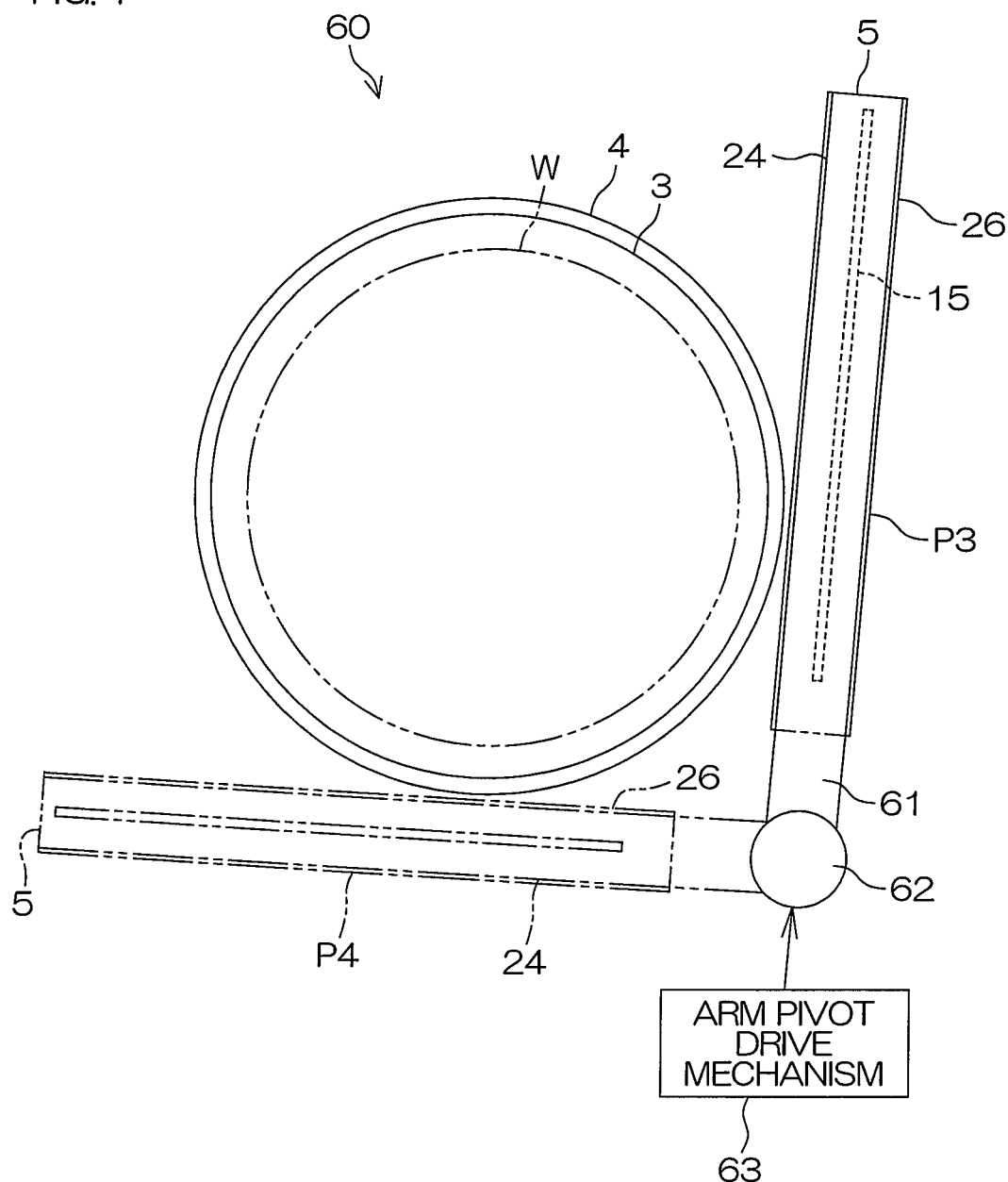
FIG. 7 is a plan view schematically showing the construction of a substrate treatment apparatus according to a second embodiment of the present invention.

FIG. 7 is a plan view schematically showing the construction of a substrate treatment apparatus 60 according to another embodiment (second embodiment) of the present invention. In the second embodiment, components corresponding to those in the first embodiment will be denoted by the same reference characters as in the first embodiment, and duplicate description will be omitted.

In the second embodiment, the slit nozzle 5 is attached to an arm 61 generally horizontally extending above the spin chuck 4. The arm 61 is supported by an arm support shaft 62 generally vertically extending on a lateral side of the spin chuck 4. An arm pivot drive mechanism 63 is connected to the arm support shaft 62. The arm support shaft 62 is pivoted by a driving force of the arm pivot drive mechanism 63, whereby the arm 61 is pivoted.

When the arm 61 is pivoted by driving the arm pivot drive mechanism 63, the slit nozzle 5 is reciprocally moved horizontally between a scan start position P3 located outside the upper region of the substrate support 3 (as indicated by a solid line in FIG. 7) and a return position P4 angularly spaced 90 degrees from the scan start position P3 about the rotation center of the wafer W outside the upper region of the substrate support 3. Since the first sheet 24 and the second sheet 26 each have a sheet length that is greater than the diameter of the wafer W, it is possible to bring the first sheet 24 and the second sheet 26 into contact with the entire upper surface of the wafer W by the pivoting of the arm 61.

When the slit nozzle 5 is moved from the scan start position P3 to the return position P4, for example, the first sheet 24 is moved in contact with a portion of the upper surface of the wafer W located forward of the hydrofluoric/nitric acid application position with respect to a forward movement direction. Thus, deactivated hydrofluoric/nitric acid is scraped away from the upper surface of the wafer W. Further, the second sheet 26 is moved in contact with a portion of the upper surface of the wafer W located rearward of the hydrofluoric/nitric acid application position with respect to the forward movement direction. Thus, hydrofluoric/nitric acid supplied onto the upper surface of the wafer W can be evenly spread.

When the slit nozzle 5 is returned from the return position P4 to the scan start position P3, the second sheet 26 is moved in contact with a portion of the upper surface of the wafer W located forward of the hydrofluoric/nitric acid application position with respect to a reverse movement direction. Thus, deactivated hydrofluoric/nitric acid is scraped away from the upper surface of the wafer W. Further, the first sheet 24 is moved in contact with a portion of the upper surface located rearward of the hydrofluoric/nitric acid application position with respect to the reverse movement direction. Thus, hydrofluoric/nitric acid supplied onto the upper surface of the wafer W can be evenly spread.

Figure 8:
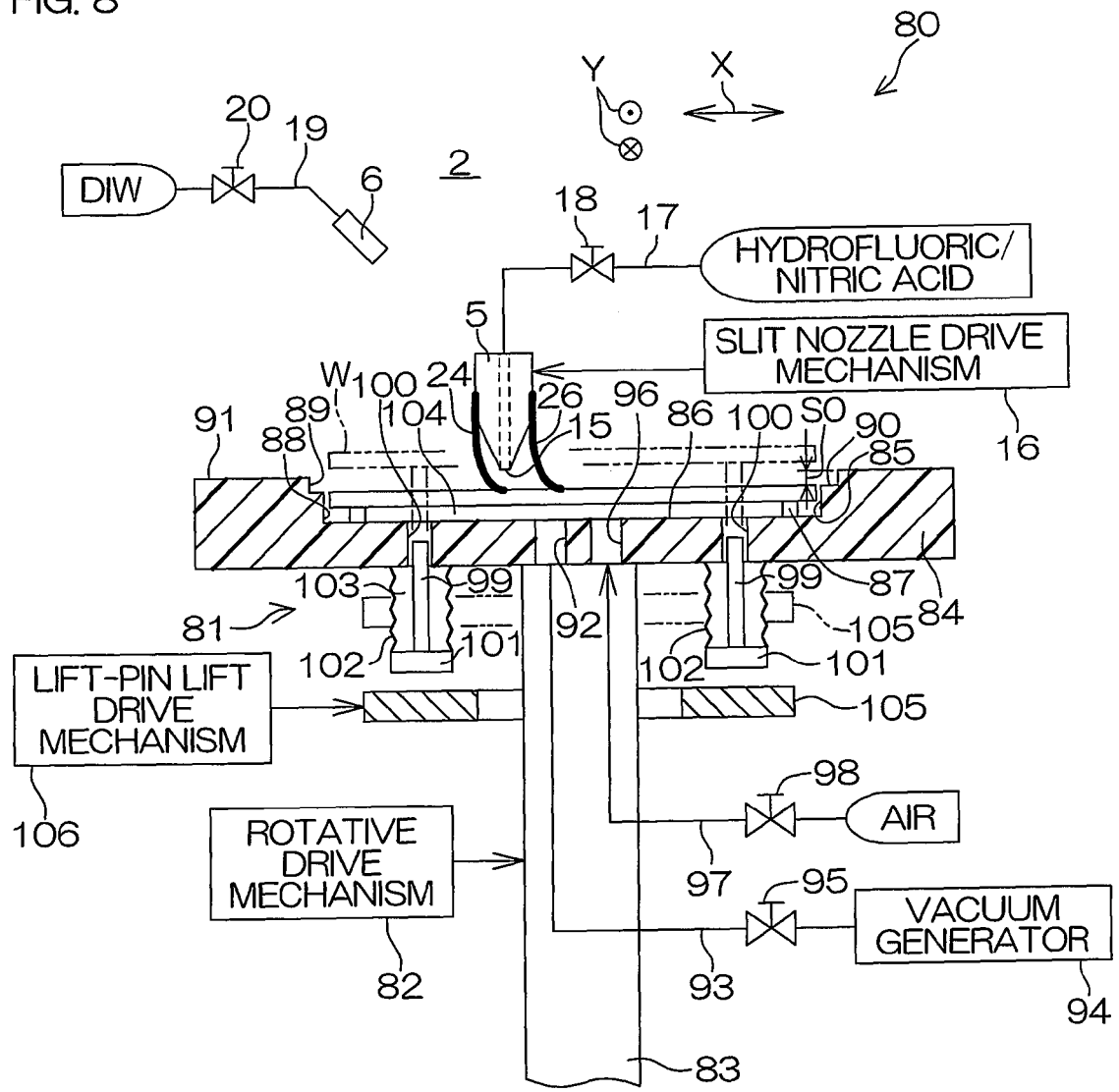
FIG. 8 is a sectional view schematically showing the construction of a substrate treatment apparatus according to a third embodiment of the present invention.

FIG. 8 is a sectional view schematically showing the construction of a substrate treatment apparatus 80 according to further another embodiment (third embodiment) of the present invention. In the third embodiment, components corresponding to those in the first embodiment will be denoted by the same reference characters as in the first embodiment, and duplicate description will be omitted.

In the third embodiment, a substrate holding mechanism 81 is employed as substrate holding mechanism instead of the substrate support 3 and the spin chuck 4. The substrate holding mechanism 81 holds and rotates the wafer W.

The substrate holding mechanism 81 includes a disk-shaped spin base 84 (base member) fixed to an upper end of a rotation shaft 83 which is rotated about a vertical axis by a rotative drive force of a rotative drive mechanism (substrate rotating mechanism) 82. The spin base 84 is formed of polyvinyl chloride, and has a flat upper surface 91.

The spin base 84 has a hollow cylindrical accommodation recess 85 provided in a center portion of an upper surface thereof for accommodating the wafer W. An annular seal member 87 serving as a support member for supporting the wafer W is provided along a peripheral edge of a bottom 86 of the accommodation recess 85 on an upper surface of the bottom 86. The lower surface of the wafer W is supported by the seal member 87. The seal member 87 may be a lip packing (see FIG. 11), or may be a surface packing. Where the lip packing is used as the seal member 87, the seal member 87 has a sufficiently rigid inner peripheral surface to precisely define the height of the upper surface of the wafer W.

An inner peripheral surface of the accommodation recess 85 includes a third cylindrical surface (opposition surface) 88 having substantially the same diameter as the wafer W, and a fourth cylindrical surface (limitation surface) 89 provided above the third cylindrical surface 88 and having a greater diameter than the third cylindrical surface 88. An annular step 90 is provided along an upper edge of the third cylindrical surface 88 to connect the third cylindrical surface 88 to the fourth cylindrical surface 89. The annular step 90 has a horizontal surface that is flush with the upper surface of the wafer W (yet to be subjected to the etching treatment) held in the accommodation recess 85. A level difference S0 between the upper surface 91 and the annular step 90 is, for example, in the range of 0.5 to 1.0 mm. The annular step 90 has a width of, for example, 0 to 3 mm.

The accommodation recess 85 has a suction port 92 provided in a center portion of the bottom 86 thereof. A suction pipe 93 is connected to the suction port 92 at one end thereof. The other end of the suction pipe 93 is connected to a vacuum generator 94. A suction valve 95 is provided in the suction pipe 93 for switchably opening and closing the suction pipe 93.

The accommodation recess 85 further has a vacuum relief port 96 provided in the center portion of the bottom 86 thereof. A third air supply pipe 97 is connected to the relief port 96 at one end thereof. The third air supply pipe 97 is connected to an air supply source, and air is supplied to the relief port 96 from the air supply source through the air supply pipe 97. A relief valve 98 for opening and closing the third air supply pipe 97 is provided in the third air supply pipe 97.

In the third embodiment, the substrate treatment apparatus 80 includes a plurality of lift pins 99 (e.g., four lift pins 99, but only two lift pins 99 are shown in FIG. 8) for moving up and down the wafer W between a position at which the wafer W is accommodated in the accommodation recess 85 and a position at which the wafer W is removed upward from the accommodation recess 85. The lift pins 99 are respectively inserted in through-holes 100 vertically extending through the spin base 84, and movable up and down with respect to the spin base 84. Lower ends of the lift pins 99 are respectively fixed to disk-shaped support plates 101. Hollow cylindrical bellows 102 extending downward from a lower surface of the spin base 84 are respectively connected to the support plates 101.

The bellows 102 are composed of a resin (e.g., polyvinyl chloride) resistant to hydrofluoric/nitric acid for stretchability, and respectively surround the lift pins 99. Upper ends of the bellows 102 are connected in intimate contact with the lower surface of the spin base 84 as respectively surrounding openings of the through-holes 100. The lower ends of the bellows 102 are respectively connected in intimate contact with the entire peripheries of the support plates 101. Spaces 103 each defined by the bellows 102 and the support plate 101 communicate with the outside only through the corresponding through-holes 100. Therefore, with the wafer W being accommodated in the accommodation recess 85, the spaces 103 and a space 104 defined between the bottom 86 and the wafer W are entirely closed.

An annular plate-shaped support ring 105 is disposed below the spin base 84 as surrounding the rotation shaft 83. The support ring 105 is not supported by the rotation shaft 83, but supported by other member, e.g., by a frame (not shown) in which the entire treatment chamber 2 is provided. Therefore, the support ring 105 is not rotated together with the rotation shaft 83. A lift-pin lift drive mechanism 106 is connected to the support ring 105. The lift pins 99 are collectively moved up and down by the lift-pin lift drive mechanism 106 between a projecting position (indicated by a two-dot-and-dash line in FIG. 8) at which the distal ends of the lift pins 99 project above the upper surface of the spin base 84 and a retracted position (indicated by a solid line in FIG. 8) at which the distal ends of the lift pins 99 are retracted below the upper surface of the bottom 86 of the spin base 84.

With the lift pins 99 being located at the retracted position, the support plates 101 and the lift pins 99 are suspended by the corresponding bellows 102. Lower surfaces of the support plates 101 do not contact the upper surface of the support ring 105, so that the lift pins 99 are supported only by the spin base 84. The bellows 102 are stretched from a non-restricted state by the weights of the lift pins 99 and the support plates 101.

When the support ring 105 is moved up from a state indicated by a solid line in FIG. 8 by driving the lift-pin lift drive mechanism 106, the upper surface of the support ring 105 is brought into abutment engagement with the lower surfaces of the support plates 101. With the support plates 101 in engagement with the support ring 105, the lift pins 99 are supported by the support ring 105. When the support ring 105 is further moved up, the lift pins 99 and the support plates 101 are moved up, whereby the bellows 102 are contracted.

With the lift pins 99 being located at the projecting position, on the other hand, the wafer W is removed upward from the accommodation recess 85. Thus, the transport robot (not shown) can access the wafer W so as to lift the wafer W from below by its hands (not shown).

When the support ring 105 is moved down from a state indicated by a two-dot-and-dash line in FIG. 8 by driving the lift-pin lift drive mechanism 106, the lift pins 99 and the support plates 101 are moved down. Thus, the bellows 102 are stretched by the downward movement. When the support ring 105 is further moved down, the support plates 101 are brought out of engagement with the support ring 105. Thus, the lift pins 99 are disengaged from the support ring 105 and, therefore, supported by the bellows 102.

When the relief valve 98 is closed and the suction valve 95 is opened with the vacuum generator 94 being active and with the wafer W being accommodated in the accommodation recess 85, air is sucked from the spaces 103 and the space 104. Since the spaces 103 and the space 104 are closed at this time, the internal pressures of these spaces 103, 104 are each reduced to a negative level. Thus, the lower surface (device formation surface) of the wafer W is held by suction. With the wafer W being held by suction, the peripheral portion of the lower surface of the wafer W is kept in intimate contact with an upper portion of the seal member 87, whereby hydrofluoric/nitric acid is prevented from intruding into the lower surface (device formation region) of the wafer W. With the wafer W being held on the spin base 84 by suction, the rotative drive mechanism 82 is rotatively driven to rotate the rotation shaft 83, whereby the wafer W is generally horizontally rotated about the vertical axis.

The bellows 102 are each allowed to have a smaller contraction per unit stress by proper material selection and geometric design. Therefore, the bellows 102 are hardly contracted by the air suction for the suction-holding of the wafer W, so that the lift pins 99 are hardly lifted.

Figure 9:
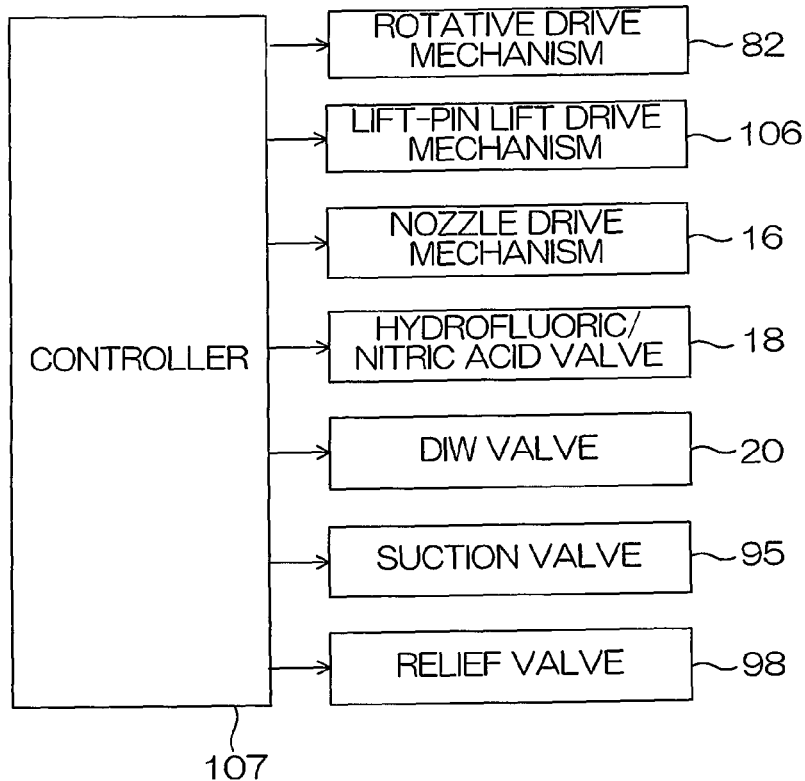
FIG. 9 is a block diagram showing the electrical construction of the substrate treatment apparatus shown in FIG. 8.

FIG. 9 is a block diagram showing the electrical construction of the substrate treatment apparatus 80.

The substrate treatment apparatus 80 includes a controller 107 including a microcomputer. The rotative drive mechanism 82, the lift-pin lift drive mechanism 106, the slit nozzle drive mechanism 16, the hydrofluoric/nitric acid valve 18, the DIW valve 20 and the like are connected as control objects to the controller 107.

Figure 10:
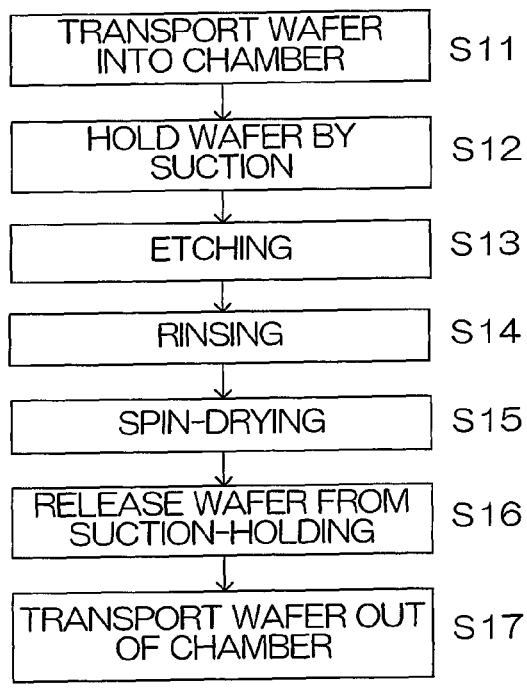
FIG. 10 is a flow chart showing an exemplary water treatment to be performed by the substrate treatment apparatus shown in FIG. 8.
Figure 11A:
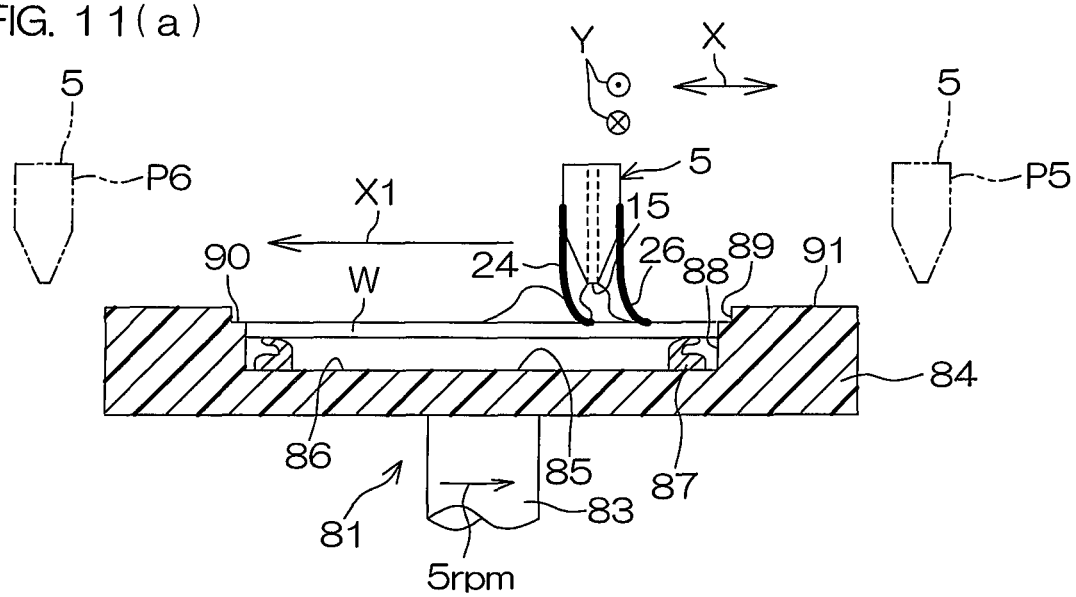
FIGS. 11(a) to 11(c) are sectional views for explaining a wafer etching treatment to be performed by the substrate treatment apparatus shown in FIG. 8.
Figure 11B:
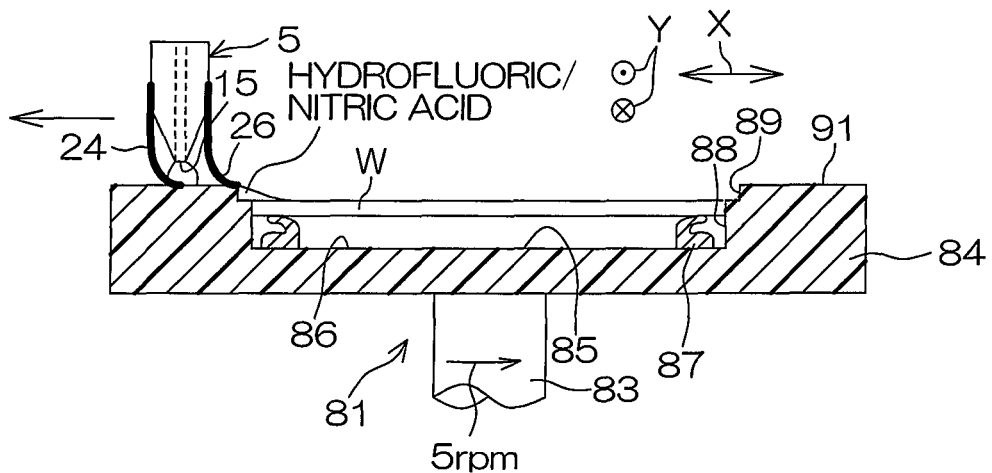
Figure 11C:
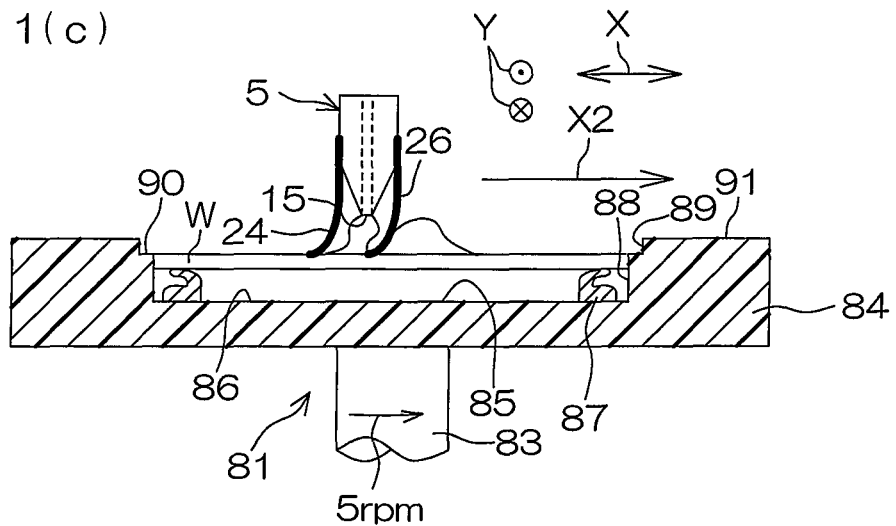

FIG. 10 is a flow chart showing an exemplary wafer treatment to be performed by the substrate treatment apparatus 80. FIGS. 11(*a*) to 11(*c*) are sectional views for explaining a wafer etching treatment to be performed by the substrate treatment apparatus 80.

Prior to the wafer treatment, the slit nozzle 5 is retracted to a retracted position on a lateral side of the substrate holding mechanism 81. The lift pins 99 are moved up to the projecting position (indicated by a two-dot-and-dash line in FIG. 8). Further, the hydrofluoric/nitric acid valve 18, the DIW valve 20, the suction valve 95 and the relief valve 98 are controlled to be closed.

For the wafer treatment, an untreated wafer W is transported into the treatment chamber 2 by the transport robot not shown. More specifically, the wafer W is rested on the lift pins 99 of the substrate holding mechanism 81. Thereafter, the controller 107 drives the lift-pin lift drive mechanism 106 to move the lift pins 99 down to the retracted position. Thus, the wafer W is accommodated in the accommodation recess 85. In this manner, the wafer W is transferred to the spin base 84 (Step S11). After the transfer of the wafer W to the spin base 84, the controller 107 opens the suction valve 95. Thus, the wafer W is held on the spin base 84 by suction (Step S12).

After the transfer of the wafer W to the spin base 84, the controller 107 drives the rotative drive mechanism 82 to rotate the spin base 84 at a lower constant rotation speed (e.g., 5 rpm). Further, the controller 107 drives the slit nozzle drive mechanism 16 to guide the slit nozzle 5 to above the wafer W.

When the slit nozzle 5 reaches above the wafer W, the controller 107 opens the hydrofluoric/nitric acid valve 18 to spout hydrofluoric/nitric acid from the slit spout 15 in the form of a stream having a profile elongated along the Y-axis. Further, the controller 107 drives the slit nozzle drive mechanism 16 to reciprocally move (or scan) the slit nozzle 5 along the X-axis between a scan start position P5 located outside an upper region of the spin base 84 (as indicated by a two-dot-and-dash line in FIG. 11(*a*)) and a return position P6 located diametrically opposite from the scan start position P5 about the rotation center of the wafer W outside the upper region of the spin base 84 (as indicated by a two-dot-and-dash line in FIG. 11(*a*)) (Step S13).

The first sheet 24 and the second sheet 26 each have a length that is greater than the diameter of the wafer W and, therefore, can be brought into contact with the entire upper surface of the wafer W.

More specifically, when the slit nozzle 5 is moved in one movement direction X1 along the X-axis as shown in FIG. 11(*a*), the first sheet 24 is brought into contact with a portion of the upper surface of the wafer W located forward of the hydrofluoric/nitric acid application position with respect to the movement direction X1. At this time, the first sheet 24 is bowed convexly forward with respect to the movement direction X1, so that the distal edge of the first sheet 24 is kept in intimate contact with the upper surface of the wafer W. As the slit nozzle 5 is moved, the first sheet 24 is moved in contact with the upper surface of the wafer W. Thus, deactivate hydrofluoric/nitric acid is scraped away from the upper surface of the wafer W.

Further, the second sheet 26 is brought into contact with a portion of the upper surface of the wafer W located rearward of the hydrofluoric/nitric acid application position with respect to the movement direction X1. At this time, the second sheet 26 is bowed convexly forward with respect to the movement direction X1, so that the distal edge of the second sheet 26 is kept in intimate contact with the upper surface of the wafer W. As the slit nozzle 5 is moved, the second sheet 26 is moved in contact with the upper surface of the wafer W. Thus, hydrofluoric/nitric acid supplied onto the upper surface of the wafer W between the first sheet 24 and the second sheet 26 is evenly spread over the upper surface of the wafer W.

Hydrofluoric/nitric acid spouted from the slit spout 15 is evenly spread by the second sheet 26 extending along the Y-axis. Therefore, even if hydrofluoric/nitric acid is spouted at a lower flow rate from the slit spout 15, hydrofluoric/nitric acid can be efficiently evenly spread over the entire upper surface of the wafer W.

When the slit nozzle 5 reaches the peripheral portion of the wafer W, the distal edges of the first sheet 24 and the second sheet 26 are located on the upper surface 91 of the spin base 84 as shown in FIG. 11(*b*). At this time, hydrofluoric/nitric acid moved together with the second sheet 26 is received by the fourth cylindrical surface 89 and retained on the annular step 90. The hydrofluoric/nitric acid retained on the annular step 90 generally flush with the wafer W is moved toward the upper surface of the wafer W after passage of the slit nozzle 5. Thus, the upper surface of the wafer W, particularly, the peripheral portion of the upper surface of the wafer W, is substantially prevented from being dried immediately after passage of the first sheet 24 and the second sheet 26.

When the slit nozzle 5 thereafter reaches the return position P6, the controller 107 drives the slit nozzle drive mechanism 16 to return the slit nozzle 5 with the hydrofluoric/nitric acid valve 18 kept open, whereby the slit nozzle 5 is moved in a movement direction X2 (opposite to the movement direction X1) along the X-axis as shown in FIG. 11(*c*).

When the slit nozzle 5 is moved in the movement direction X2 along the X-axis, the second sheet 26 is brought into contact with a portion of the upper surface of the wafer W located forward of the hydrofluoric/nitric acid application position with respect to the movement direction X2. As the slit nozzle 5 is moved, the second sheet 26 is moved in contact with the upper surface of the wafer W. Thus, deactivated hydrofluoric/nitric acid is scraped away from the upper surface of the wafer W.

Further, the first sheet 24 is brought into contact with a portion of the upper surface of the wafer W located rearward of the hydrofluoric/nitric acid application position with respect to the movement direction X2. As the slit nozzle 5 is moved, the first sheet 24 is moved in contact with the upper surface of the wafer W. Thus, hydrofluoric/nitric acid supplied onto the upper surface of the wafer W between the first sheet 24 and the second sheet 26 is evenly spread over the upper surface of the wafer W. During the movement of the slit nozzle 5, the flow rate of hydrofluoric/nitric acid spouted from the slit nozzle 5 is kept at a constant level (e.g., 1.2 L/min).

After the etching treatment is performed for a predetermined period (e.g., 300 seconds), the controller 107 closes the hydrofluoric/nitric acid valve 18 to stop the spouting of hydrofluoric/nitric acid from the slit nozzle 5. Further, the controller 107 drives the slit nozzle drive mechanism 16 to retract the slit nozzle 5 to the retracted position on the lateral side of the substrate holding mechanism 81.

In turn, the controller 107 controls the rotative drive mechanism 82 to accelerate the spin base 84 to a predetermined rinsing rotation speed (about 100 rpm), and opens the DIW valve 20 to supply DIW from the DIW nozzle 6 toward the rotation center of the upper surface of the rotating wafer W (Step S14). Thus, a rinsing process is performed on the wafer W to wash away hydrofluoric/nitric acid from the wafer W. During the rinsing process, the flow rate of DIW spouted from the DIW nozzle 6 is, for example, 2.0 L/min.

After the rinsing process is performed for a predetermined period (e.g., 60 seconds), the controller 107 closes the DIW valve 20 to complete the rinsing process. Further, the controller 107 controls the rotative drive mechanism 82 to accelerate the spin base 84 to a predetermined drying rotation speed (about 1000 to about 2000 rpm). Thus, a spin-drying process is performed on the wafer W to spin out DIW from the upper surface of the wafer W by a centrifugal force (Step S15).

After the spin-drying process is performed for a predetermined period (e.g., 30 seconds), the controller 107 controls the rotative drive mechanism 82 to stop the rotation of the spin base 84. Thereafter, the controller 107 opens the relief valve 98 to relieve the vacuum in the spaces 103 and the space 104. Thus, the wafer W is released from the suction holding (Step S16).

Subsequently, the controller 107 drives the lift-pin lift drive mechanism 106 to move the lift pins 99 up to the projecting position. Thus, the treated wafer W is removed upward from the accommodation recess 85.

Thereafter, the treated wafer W is transported out of the treatment chamber 2 by the substrate transport robot (Step S17).

While the three embodiments of the present invention have thus been described, the invention may be embodied in other ways.

In the embodiments described above, the slit nozzle 5 is adapted to be reciprocally scanned by way of example, but may be scanned in one direction. Particularly, where the slit nozzle 5 is scanned in one direction in the second embodiment, the arm 61 may be continuously rotated in one direction. In this case, hydrofluoric/nitric acid is spouted only when the slit nozzle 5 passes over the wafer W.

Further, a multi-spout nozzle having a multiplicity of spouts arranged along the Y-axis in the lower end surface of the nozzle body 22 may be used instead of the slit nozzle 5.

In the embodiments described above, the length of the slit spout 15 is greater than the diameter of the wafer W to be treated. However, the length of the slit spout 15 may be smaller than the diameter of the wafer W. In this case, the length of the slit spout 15 is, for example, about 20 mm. Even in this case, hydrofluoric/nitric acid supplied onto the upper surface of the wafer W can be evenly spread by the second sheet 26 to form a thin liquid film on the entire upper surface of the wafer W.

A single straight nozzle or a plurality of straight nozzles which are each adapted to spout hydrofluoric/nitric acid in the form of a continuous stream may be used instead of the slit nozzle 5.

The substrate treatment apparatuses may each be adapted to perform the etching treatment on a non-rotating still wafer W by moving a nozzle (preferably the slit nozzle 5) while supplying hydrofluoric/nitric acid onto the wafer W. In this case, the chuck rotative drive mechanism 7 needs not to be connected with the spin chuck 4 shown in FIG. 1A, and the rotative drive mechanism 82 needs not to be connected with the substrate holding mechanism 81 shown in FIG. 8.

The first sheet 24 and the second sheet 26 are not limited to the mesh sheets, but may be porous sheets, for example. A flexible material (soft and resilient material) may be used for the first sheet 24 and the second sheet 26. Other than PFA, PP (polypropylene) or polyvinyl chloride, for example, may be used as the material for the first sheet 24 and the second sheet 26.

In the three embodiments described above, the substrate treatment apparatuses 1, 60, 80 are each adapted to perform the etching treatment on the wafer W for thinning the wafer W by way of example, but may be adapted to perform the etching treatment for removing an oxide film from a device formation surface (upper or lower surface) of a disk-shaped oxide silicon wafer W. In this case, hydrofluoric acid, for example, is preferably used as the etching liquid. Where the etching treatment is performed for removing a nitride film from the wafer W, phosphoric acid may be used as the etching liquid.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-21779 filed in the Japanese Patent Office on Jan. 31, 2008 and No. 2008-307996 filed in the Japanese Patent Office on Dec. 2, 2008, the disclosure of which are incorporated herein by reference in its entirety.

What is claimed is:

1. A substrate treatment apparatus comprising:
a substrate holding mechanism which holds a substrate;
a nozzle body having a spout which spouts an etching liquid toward a major surface of the substrate held by the substrate holding mechanism;
a nozzle body movement mechanism which moves the nozzle body in a predetermined movement direction so as to move an etching liquid application position at which the etching liquid spouted by the nozzle body reaches the major surface;
a first single unitary flexible sheet made of a flexible material and attached to the nozzle body, said first flexible sheet being disposed to be brought into contact with a portion of the major surface of the substrate located on one of opposite sides of said nozzle body with respect to the movement direction, the first flexible sheet being extended from the nozzle body so as to be bowed convexly forward with respect to the movement direction with a distal edge thereof being in contact with the major surface; and a second single unitary flexible sheet made of said flexible material and attached to the nozzle body, said second flexible sheet being disposed to be brought into contact with a portion of the major surface of the substrate located on the other of said opposite sides of said nozzle body with respect to the movement direction, the second flexible sheet being extended from the nozzle body so as to be bowed convexly forward with respect to the movement direction with a distal edge thereof being in contact with the major surface.

2. A substrate treatment apparatus as set forth in claim 1, wherein the first flexible sheet and the second flexible sheet are brought into contact with the entire major surface by moving the nozzle body by means of the nozzle body movement mechanism.

3. A substrate treatment apparatus as set forth in claim 1, wherein the first flexible sheet and the second flexible sheet are attached to the nozzle body as extending perpendicularly to the movement direction.

4. A substrate treatment apparatus as set forth in claim 1, wherein the spout includes a slit spout having a linear opening extending in a predetermined opening direction,
wherein the second flexible sheet is attached to the nozzle body as extending in the predetermined opening direction.

5. A substrate treatment apparatus as set forth in claim 1, wherein the nozzle body movement mechanism moves the nozzle body in the movement direction so as to bring the second flexible sheet out of contact with the major surface of the substrate.

6. A substrate treatment apparatus as set forth in claim 1, wherein the first flexible sheet and the second flexible sheet each have a multiplicity of passage holes through which the etching liquid is supplied onto the major surface passes.

7. A substrate treatment apparatus as set forth in claim 1, wherein the substrate holding mechanism includes a support member which horizontally supports the substrate, and a limitation surface disposed on a lateral side of the major surface of the substrate supported by the support member for receiving a part of the etching liquid moved together with the second flexible sheet.

8. A substrate treatment apparatus as set forth in claim 7, wherein the substrate holding mechanism further includes an opposition surface which is brought into opposed relation to a peripheral surface of the substrate supported by the support member, and a step which connects the opposition surface and the limitation surface for retaining the part of the etching liquid received by the limitation surface.

9. A substrate treatment apparatus as set forth in claim 7, wherein the substrate holding mechanism includes a substrate support, and a base member which supports the substrate support,
wherein the substrate support includes the support member and the limitation surface.

10. A substrate treatment apparatus as set forth in claim 7, wherein the substrate holding mechanism includes a base member which includes the support member and the limitation surface.

11. A substrate treatment apparatus as set forth in claim 1, wherein the nozzle body movement mechanism reciprocally moves the nozzle body along the movement direction.

12. A substrate treatment apparatus as set forth in claim 1, further comprising a substrate rotating mechanism which rotates the substrate held by the substrate holding mechanism.

13. A substrate treatment method comprising the steps of:
supplying an etching liquid from a spout of a nozzle body toward a major surface of a substrate held by a substrate holding mechanism;

moving the nozzle body in a predetermined movement direction so as to move an etching liquid application position at which the etching liquid spouted by the nozzle body reaches the major surface;

bringing a first single unitary flexible sheet made of a flexible material and attached to the nozzle body, into contact with a portion of the major surface of the substrate located on one of opposite sides of said nozzle body with respect to the movement direction, the first flexible sheet being extended from the nozzle body so as to be bowed convexly forward with respect to the movement direction with a distal edge thereof being in contact with the major surface, to remove the liquid from the one side portion; and bringing a second single unitary flexible sheet made of a flexible material and attached to the nozzle body, into contact with a portion of the major surface of the substrate located on the other of said opposite sides of said nozzle body with respect to the movement direction, the second flexible sheet being extended from the nozzle body so as to be bowed convexly forward with respect to the movement direction with a distal edge thereof being in contact with the major surface, so as to evenly spread the supplied etching liquid over the major surface.

14. A substrate treatment method as set forth in claim 13, wherein said flexible material is a mesh.

15. A substrate treatment method as set forth in claim 14, wherein said flexible material is composed of a resin.

16. A substrate treatment method as set forth in claim 13, wherein said flexible material is composed of a resin.

17. A substrate treatment apparatus as set forth in claim 1, wherein said flexible material is a mesh.

18. A substrate treatment apparatus as set forth in claim 17, wherein said flexible material is composed of a resin.

19. A substrate treatment apparatus as set forth in claim 1, wherein said flexible material is composed of a resin.

20. A substrate treatment apparatus as set forth in claim 19, wherein said flexible material is composed of PFA.

* * * * *